(12) United States Patent
Wright

(10) Patent No.: US 6,956,392 B2
(45) Date of Patent: Oct. 18, 2005

(54) HEAT TRANSFER APPARATUS FOR BURN-IN BOARD

(75) Inventor: Nathan W. Wright, Missouri City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/750,437

(22) Filed: Dec. 30, 2003

(65) Prior Publication Data

US 2005/0146343 A1  Jul. 7, 2005

(51) Int. Cl.[7] .......................................... G01R 31/02
(52) U.S. Cl. ...................... 324/760; 324/755
(58) Field of Search ................ 324/755, 760, 324/765; 165/80.2–80.3; 219/209, 483; 361/697, 361/702–703, 718

(56) References Cited

U.S. PATENT DOCUMENTS

| | | | |
|---|---|---|---|
| 5,162,974 A | * | 11/1992 | Currie .......................... 361/702 |
| 5,528,466 A | * | 6/1996 | Lim et al. .................... 361/820 |
| 5,574,384 A | | 11/1996 | Oi |
| 5,648,893 A | * | 7/1997 | Loo et al. .................... 361/820 |
| 5,685,885 A | | 11/1997 | Khandros et al. |
| 5,694,049 A | | 12/1997 | Singh et al. |
| 5,865,639 A | | 2/1999 | Fuchigami et al. |
| 5,911,897 A | | 6/1999 | Hamilton |
| 6,072,322 A | | 6/2000 | Viswanath et al. |
| 6,124,720 A | | 9/2000 | Pfaff et al. |
| 6,144,215 A | | 11/2000 | Maxwell et al. |
| 6,160,394 A | | 12/2000 | Kasai et al. |
| 6,204,678 B1 | | 3/2001 | Akram et al. |
| 6,288,371 B1 | | 9/2001 | Hamilton et al. |
| 6,383,825 B1 | | 5/2002 | Farnworth et al. |
| 6,504,392 B2 | | 1/2003 | Fredeman et al. |
| 6,533,159 B1 | | 3/2003 | Cobbley et al. |
| 6,549,418 B1 | * | 4/2003 | Deeney ....................... 361/736 |
| 6,559,665 B1 | | 5/2003 | Barabi |
| 6,570,398 B2 | | 5/2003 | Murphy et al. |
| 6,628,129 B2 | | 9/2003 | Vizcara et al. |
| 6,778,393 B2 | * | 8/2004 | Messina et al. ............. 361/699 |

* cited by examiner

Primary Examiner—Minh N. Tang
(74) Attorney, Agent, or Firm—Yingsheng Tung; Wade James Brady, III; Frederick J. Telecky, Jr.

(57) ABSTRACT

An apparatus for transferring heat from semiconductor devices during a burn-in operation is disclosed. The apparatus includes a substantially planar base board through which a plurality of openings are extended. Heat sinks coordinated with the openings are connected to biasing members and come in contact with the semiconductor devices during the burn-in operation for transferring heat from the devices.

11 Claims, 6 Drawing Sheets

HEAT TRANSFER APPARATUS FOR BURN-IN BOARD

TECHNICAL FIELD

The present invention relates to a burn-in procedure performed during semiconductor manufacturing and testing, and, more particularly, to a heat sink for a burn-in board used to perform the procedure.

BACKGROUND OF THE INVENTION

A semiconductor device can be tested in a stress test referred to as a burn-in test using a printed circuit board or burn-in board that is designed to receive the semiconductor device. The burn-in board includes an array of sockets and interconnecting printed circuit traces or electrical leads. The burn-in board can be plugged into edge connectors in a rack in an oven after being loaded with the semiconductor devices to be tested. The edge connectors electrically connect the semiconductor devices and sockets to test signal generating circuits proximate the oven. The oven is then closed to seal the semiconductor devices in the oven while the ambient air in the oven is heated and the semiconductor devices are operated by the test signal generator circuits. Unreliable semiconductor devices fail and the rest of the semiconductor devices can be further tested and eventually sold.

Typical sockets used for burn-in testing include a base member formed of electrically insulative material in which an electrical contact element is mounted for each lead of the semiconductor device to be tested. The contact elements can be arranged in a selected pattern relative to a semiconductor device provided in the base and have movable contact portions adapted to move into and out of electrical engagement with respective leads of the semiconductor device. Typically, a cover member can be movably mounted on the base and can be provided with a structure that allows the contact elements to move away from a semiconductor device mounting seat when the cover member is in an open position. This permits placement of a semiconductor device in and removal of the semiconductor device from the socket. When the cover member is moved to a closed position the contact elements are caused to move into electrical engagement with the respective leads of the semiconductor device.

Semiconductor devices can be become heated during the burn-in test to potentially undesirable or excessive temperatures. Excessive temperatures may affect the performance of the circuit and cause permanent degradation of the semiconductor device. It is, therefore, desirable to hold the temperature of the semiconductor device at a relatively constant temperature throughout the burn-in test.

The traditional method for cooling semiconductor devices during burn-in that has been through convection heat transfer. Using this method, heat is dissipated from the semiconductor device through the outer surfaces of the device into still or moving air. As the integration level (i.e., the number of transistors per device) of semiconductor devices increases, or the power requirements, or the operating speed of these semiconductor devices increases, the amount of heat generated by these semiconductor devices increases to a point where conventional convection solutions are inadequate. This poses a particular problem when testing semiconductor devices housed within packages having a low thermal mass. If the semiconductor device is not adequately cooled during the test, and is permitted to rise significantly above a designated test temperature, the semiconductor device may suffer permanent degradation. In such instances, the semiconductor device must be discarded.

SUMMARY OF THE INVENTION

The present invention relates to an apparatus for transferring or dissipating heat during a burn-in procedure. The apparatus comprises a substantially planar base member, a plurality of heat sinks, and biasing members. The base member includes a plurality of openings that extend through the base member. At least one opening is arranged through the base member to correspond with each location of a socket of a burn-in board. At least one heat sink is aligned with each opening. The heat sinks each have a contact surface for engaging semiconductor devices positioned in respective sockets of the burn-in board. The biasing members are connected to the heat sinks for pressing the contact surfaces of the heat sinks against semiconductor devices positioned in the respective sockets.

The present invention also relates to a burn-in system for burning-in a plurality of semiconductor devices. The burn-in system comprise a burn-in board that includes a plurality of sockets arranged on a surface of the burn-in board. Each socket receives a semiconductor device. A substantially planar base member is substantially removed from the burn-in board. The base member includes a plurality of openings extending through the base member. At least one opening is arranged through the base member to correspond with each location of the sockets on the burn-in board. At least one heat sink is aligned with each opening. The heat sinks each have a surface for engaging the semiconductor devices positioned in the respective sockets. Biasing members are connected to the heat sinks for pressing the surfaces of the heat sinks against the semiconductor devices positioned in the respective sockets.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention relates to an apparatus for transferring or dissipating heat (i.e., heat transfer apparatus) from semiconductor devices during a burn-in procedure. The burn-in procedure tests the reliability of the semiconductor devices during semiconductor device qualification and production. The heat transfer apparatus comprises a substantially planar base member that is spaced apart and substantially overlies a burn-in board during the burn-in procedure. The burn-in board comprises a circuit board and a plurality of sockets arranged on the circuit board. The plurality of sockets are designed to hold the semiconductor devices for electric testing during the burn-in procedure. The substantially planar base member includes a plurality of openings extending through the base member so that at least one opening corresponds with (i.e., overlies) each of the sockets of the burn-in board. The openings overlying each socket provide access for repair, measurement, and/or visual inspection of the semiconductor devices when the base member is attached to the burn-in board.

Heat sinks are connected to the base member at positions on the base member, which correspond to (i.e., overlie) the sockets of the burn-in board. Connecting the heat sinks to the base member allows the use of relatively inexpensive open sockets instead of sockets with integrated heat sinks, or sockets with clip-on type heat sinks individually attached to each open socket of the burn-in board. Sockets with integrated heat sinks are more expensive for each socket position than open sockets. Individually attaching clip-on heat sinks to the open top sockets can be more time and labor intensive than attaching the apparatus of the present invention. Use of the open top sockets retains the use of automated loading equipment as opposed to the integrated heat sink sockets or flip lid (e.g., clam shell) sockets.

The heat sinks each have a surface for engaging semiconductor devices positioned in the corresponding sockets. The heat sinks are biased by biasing members to press the surfaces of the heat sinks against the semiconductor devices positioned in the corresponding sockets. The biasing members provide a more compliant fit of the heat sinks to the semiconductor devices loaded in the sockets of the burn-in board. This acts as a compensation for dimensional variation in the burn-in board and the base member. The biasing means also provides consistent force at the interface of the heat sink with semiconductor device loaded in the socket on the burn-in board.

Figure 1:
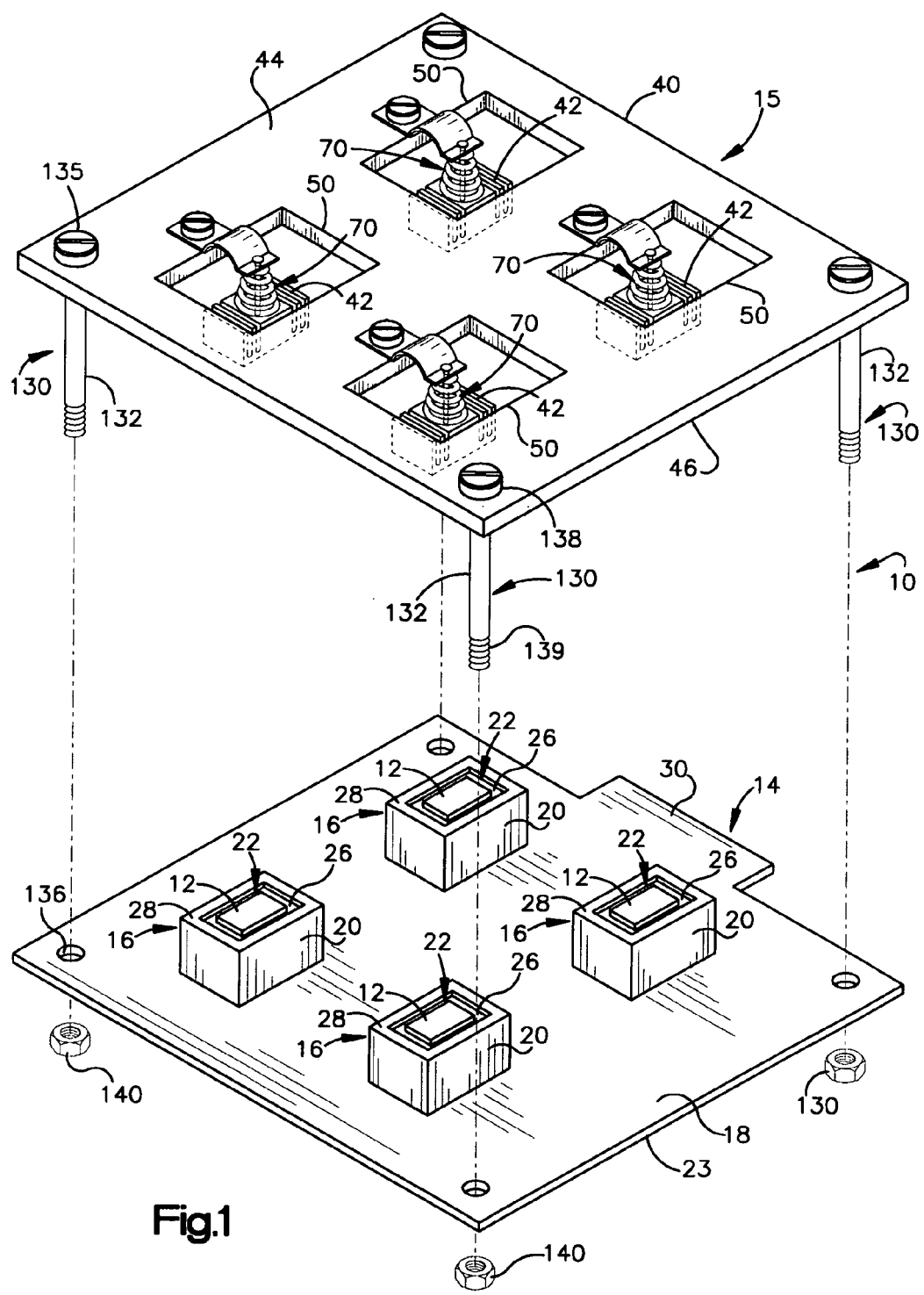
FIG. 1 illustrates a schematic perspective view of a portion of a burn-in system in accordance with an aspect of the present invention.

FIG. 1 illustrates a perspective view of a burn-in system 10 for burning-in a plurality of semiconductor devices 12. The burn-in system 10 includes a burn-in board 14 for receiving and testing a plurality of semiconductor devices 12 and an apparatus 15 (i.e., heat transfer apparatus) for removing heat from the semiconductor devices 12 during a burn-in procedure. Examples of semiconductor devices 12 that can be tested can include packaged and unpackaged dice. The packaged dice can include, but are not limited to, ball grid array packages, flip-chip packages, and quad flat packages. It will be appreciated that other semiconductor devices can be tested using the burn-in system 10.

The burn-in board 14 has a substantially planar shape and includes a plurality of sockets 16 that are mounted on a surface 18 of the burn-in board 14. The plurality of sockets 16 can temporarily hold the semiconductor devices 12 for electrical communication during testing (i.e., the burn-in procedure). Each socket 16 can include a base member 20 formed from an electrically insulative material. The base member 20 defines a mounting seat 22 in which the semiconductor device 12 to be tested can be positioned. The mounting seat 22 can comprise a recess 26 in the top portion 28 of the socket 16. The recess 26 is sized to receive the semiconductor devices 12 to be tested.

The mounting seat 22 of each socket 16 can include an electrical contact element (not shown) that can be contacted with each lead (not shown) of the semiconductor device 12 to be tested. The contact elements can be arranged in a selected pattern relative to a semiconductor device 12 provided in the mounting seat 22. The contact elements can have, for example, movable contact portions adapted to move into and out of electrical engagement with respective leads of the semiconductor device 12. By way of example, the contact elements can include electrical clips, conductive traces or vias, as well as double-ended electrical pogo-pins. It will be appreciated that the contact elements can include any other type of electrical connector that is capable of providing temporary and repeatable electrical connection between the socket 16 and the semiconductor device 12.

The burn-in board 14 can be formed of an electrically insulating material that is substantially rigid and resistant to fatigue. Typical electrical insulating materials that can be used include materials used to form printed circuit boards. Electrical insulating materials used to form printed circuit boards can include glasses and plastics, such as FR-4 board, glass filled plastics and ceramics. These electrical insulating materials, however, are generally only moderately rigid. Accordingly, where a moderately rigid electrically insulating material is use to form the burn-in board 14, a support member (not shown) can be used to increase the rigidity (i.e., decrease flexure) of the burn-in board 14. In one aspect of the invention, the support member can comprise metal (e.g., aluminum) rails that are attached to a surface 23 of the burn-in board 14 opposite the surface 18 on which the sockets 16 are provided. In another aspect, the support member can include an array or grid of metal rods that are attached to the surface 23 of the burn-in board 14 opposite the surface 18 on which the sockets 16 are provided. It will be appreciated that the support frame can have other constructions as long as these other constructions increase the rigidity of the burn-in board 14. It will also be appreciated that the burn-in board 14 can be formed of an electrically insulating material that is substantially rigid and does not require the use of a support frame to improve rigidity.

The burn-in board 14 can include a plurality of patterns of conductors (not shown). Each socket 16 on the surface 18 of the burn-in board 14 can have an associated pattern of conductors. The conductors can have terminal portions (not shown) in electrical communication with an external connector 30 for the sockets 16. The external connector 30 can be formed as a male or female electrical connector adapted for mating engagement with a corresponding male or female connectors.

The burn-in board 14 is adapted for placement in a burn-in chamber (not shown) with temperature cycling capabilities, such as a burn-in convection oven. In addition, the external connector 30 is adapted for electrical connection to testing circuitry (not shown) and programming circuitry (not shown). Specifically the testing circuitry is adapted to apply test signals for testing the semiconductor devices 12 and detecting defects. The programming circuitry is adapted to apply programming signals for correcting programmable defects.

The heat transfer apparatus 15 can be connected to the burn-in board 14 so that the heat transfer apparatus 15 substantially overlies the burn-in board 14. The heat transfer apparatus 15 comprises a base member 40 and a plurality of heat sinks 42 that are connected to the base member 40. The base member 40 comprises a substantially planar plate with a top surface 44 and substantially coplanar bottom surface 46. The terms top and bottom used herein is meant to refer only to the views in the respective FIGS. and is not meant to limit the invention. The base member 40 has a substantially low-profile to minimize obstruction of the air flow during a burn-in procedure performed in a convection oven (not shown).

The base member 40 can be formed of a substantially rigid material that is resistant to fatigue. An example of a substantially rigid material that can be used to form the base member 40 includes a metal plate, such as a high-grade aluminum plate. It will be appreciated that other metals (e.g. steel) and other materials can be used to form the base member 40 as long as these other materials maintain their rigidity at elevated temperatures (e.g., greater that 100° C.) and are resistant to fatigue.

Figure 2:
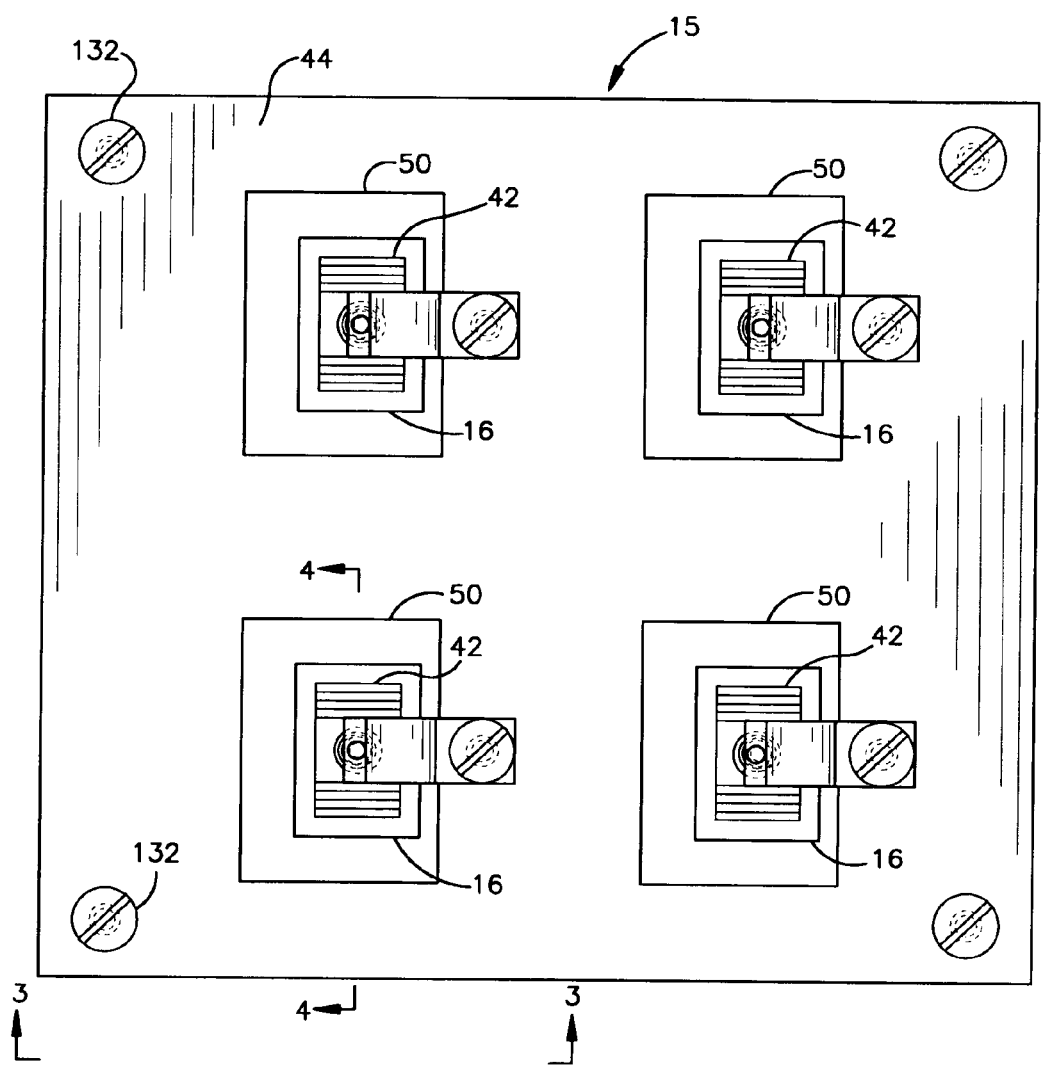
FIG. 2 illustrates a top plan view of a heat transfer apparatus and burn-in board of FIG. 1 in accordance with the present invention.

Referring also to FIG. 2, which is a top-plan view of the heat transfer apparatus 15, the base member 40 includes a plurality of substantially rectangular openings 50 that extend through the base member 40 from the top surface 44 to the bottom surface 46. The openings 50 are arranged in the base member 40 such that each opening 50 corresponds with or overlies one socket 16 of the burn-in board 14 to which the base member 40 is attached. Arranging the openings 50 to correspond with the sockets 16 of the burn-in board allows the sockets 16 as well as semiconductor devices 12 positioned in the sockets 16 to be readily accessed for repair, measurement, and/or visual inspection once the heat transfer apparatus 15 is attached to the burn-in board 14.

The openings 50 can be formed in the base member 40, for example, by milling the base member 40 at locations that correspond to locations of the sockets 16 on the burn-in board 14. It will be appreciated that other techniques can be used to form the openings 50 and that these technique can be a function of the particular material from which the base member 40 is formed. It will also be appreciated that although the openings 50 are illustrated as having substantially rectangular shapes, the openings 50 can have other shapes, such as circular, square, and polygonal.

Figure 3:
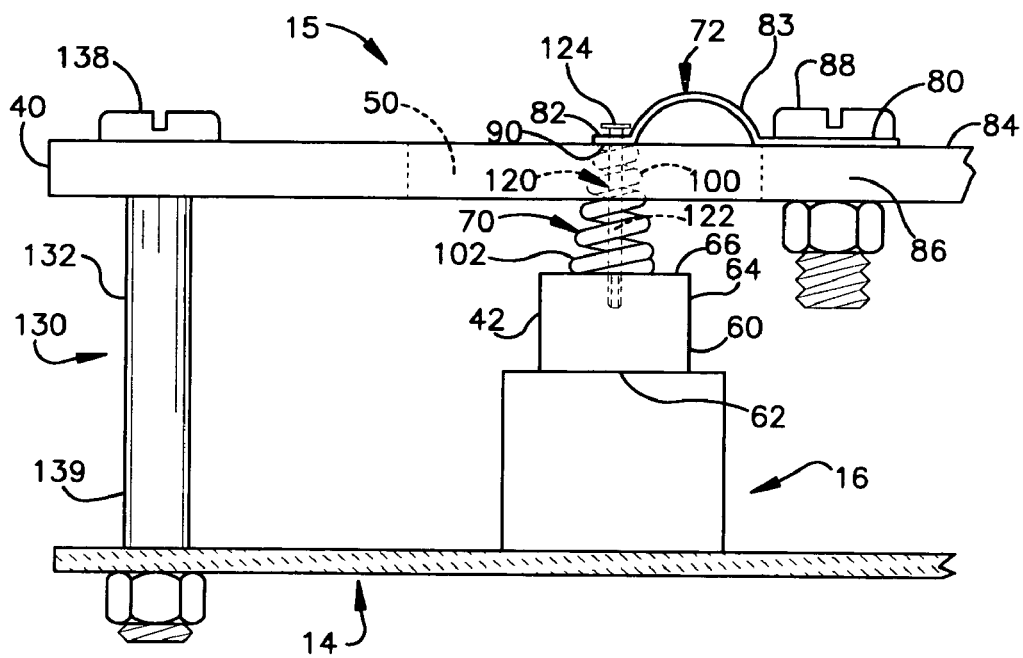
FIG. 3 illustrates a schematic cross-sectional view taken along lines 3—3 of FIG. 2 of a portion of the heat transfer apparatus and burn-in board.
Figure 4:
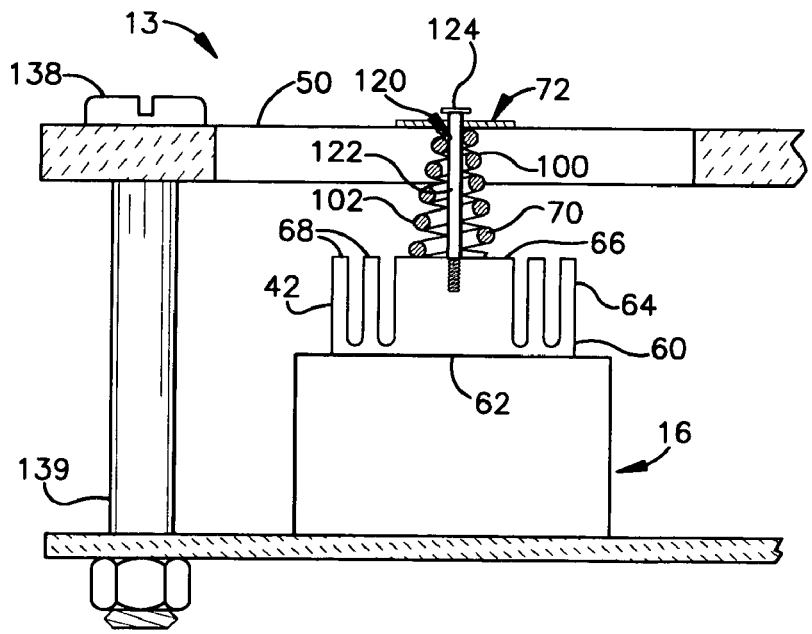
FIG. 4 illustrates a schematic cross-sectional view taken along lines 4—4 of FIG. 2 of a portion of the heat transfer apparatus and burn-in board.

The heat sinks 42, which are connected to the base member 40, are arranged below the openings 50 such that each heat sink 42 is aligned below one opening 50 of the base member 40 and over one socket 16 of the burn-in board 14. FIGS. 3 and 4 are cross-sectional views taken along lines 3—3 and 4—4, respectively, of FIG. 2 of one of the heat sinks 42 of the heat transfer apparatus 15 positioned over a socket 16. It will be appreciated that the description of the heat sink 42 of the heat transfer apparatus 15 positioned over the socket 16 illustrated in FIGS. 3 and 4 is also applicable to the other heat sinks 42 of the heat transfer apparatus 15 positioned over sockets 16.

The heat sink 42 has a bottom portion 60 with a contact surface 62 for contacting an exposed portion of a semiconductor device (not shown) positioned in the socket 16 of the burn-in board 14. The heat sink 42 provides a thermal mass for absorbing heat that is generated by the semiconductor device while the semiconductor device is being tested, and also acts to dissipate heat away from the semiconductor device. The contact surface 62 of the bottom portion 60 of the heat sink 42 can have length and width dimensions (i.e., surface area) equal to or larger than the length and width of the exposed portion of the semiconductor device to provide the largest area of thermal contact between the heat sink 42 and the semiconductor device. Alternatively, the contact surface 62 can have a surface area that is slightly smaller the surface area of the exposed portion of the semiconductor device. Providing the heat sink 42 with a contact surface that has a surface area slightly smaller than the surface area of the exposed portion of the semiconductor device can be desirable to avoid damaging the edges of the semiconductor device when the heat sink 42 is pressed against the exposed portion of the semiconductor device. It is known that semiconductor devices, such as silicon dice, can be susceptible to cracking at or near the edges of the dice where sheer stress concentration and the possibility of mechanical damage are at their highest.

The heat sink 42 can also include a top portion 64 with a top surface 66 that is opposite and spaced apart from the contact surface 62. The top portion 64 can include a plurality of upstanding spaced apart heat dissipating fins 68 that increase the surface area of the top portion 64 of the heat sink 42 and allow the heat sink 42 to more readily dissipate heat.

The heat sink 42 can be made of material that has a high thermal capacitance as well as a high thermal conductance. For example, in one aspect of the invention, the heat sink 42 can comprise a metal, such as anodized aluminum. It will be appreciated that the heat sink 42 can include other metals as well as other non-metal materials, such as thermally conductive ceramics and thermally conductive resins. The heat sink 42 can also contain a thermal interface material along the contact surface 62 to increase the efficiency of thermal transfer of the heat sink 42. Optionally, the heat sink 42 can contain a material, such as nickel, along the contact surface for wear resistance.

Referring again to FIG. 1, each heat sink 42 is connected to the base member 40 with a biasing member 70. The biasing members 70 provides a consistent force at the interface between the heat sinks 42 and the semiconductor devices 12 loaded in the sockets 16 of the burn-in board 14. Thermal transfer from the semiconductor devices 12 loaded in the sockets 16 of the burn-in board 14 to the heat sinks 42 is dependent on this consistent force. The consistent force provides a consistent thermal transfer, which in turn provides more control of heat transfer during burn-in.

Referring again to FIGS. 3 and 4, the biasing member 70 extends through the opening 50 and suspends the heat sink 42 from a support structure 72. Connecting the heat sink 42 to the support structure 72 and the base member 40 using the biasing member 70 provides the heat sink 42 with a more compliant fit with the semiconductor device (not shown) loaded in the socket 16 of the burn-in board 14. This more compliant fit provides compensation for dimensional variations in the burn-in board 14 and the base member 40.

The biasing member 70 has a first end 100, which is attached to a surface 90 of the support structure 72 by, for example, a screw, a weld, adhesive or other fastening means, and a second end 102 that is attached to the top portion 64 of the heat sink 42, by, for example, a screw, a weld, adhesive, or other fastening means. The biasing member 70 can comprise any member that is capable of exerting a constant force on the heat sink 42. In one aspect, the biasing member 70 can comprise a spring. The spring can include any type of general compression member which applies a constant force, such as an open or closed spring, a torsion spring, a load spring, a lever spring, a volute spring, a Belleville washer, a conical compression spring, or any other type of spring. By way of example, the biasing member 70 can be formed from an elastically resilient material, such as spring steel, spring alloys (e.g., beryllium alloys, copper alloys, and aluminum alloys), and other metals that are elastically resilient when formed into a spring. The biasing member 70 can be sized and shaped to exert a predetermined force on the top portion 64 of the heat sink 42. This force can be evenly distributed by the heat sink 42 against the semiconductor device loaded in the socket 16. It will be appreciated that the biasing member 70 can comprises other compliant means and/or moveable means, such as a bellows or lever, which are capable of exerting a constant force against the heat sink 42.

The support structure 72 comprises an elongated member with a first end 80 and a second end 82. A middle portion 83 of the support structure 72 interconnects the first end 80 and the second end 82. Although the middle portion 83 is illustrated as having a substantially arcuate shape, the shape of the middle portion 83 is not limited and can be, for example, planar or flat so that the support structure 72 has a substantially planar or flat shape. The support structure 72 can be formed of a substantially rigid material, such as a rigid metal or a rigid resin, that is capable of being formed (e.g., machined, stamped, or molded) into the shape of the support structure 72.

The first end 80 of the support structure 72 is connected to a top surface 84 of a portion 86 of the base member 40 adjacent the opening 50 with a fastening means 88, such as a screw. Other fastening means, such as clamps, welds, and/or adhesives can be used to attach the first end 80 of the support structure 72 to the top surface 84. The second end 82 of the support structure 72 extends over the opening 50 in the base member 40 and provides a surface 90 to which the biasing member 74 is attached.

A stabilization member 120 can also be connected to the heat sink 42 to substantially inhibit lateral (i.e., side to side) and torsional (i.e., twisting) movement of the heat sink 42, while allowing longitudinal (upward and downward) movement. The stabilization member 120 can include a substantially elongated member that can have a shank portion 122 and a head portion 124. The shank portion 122 extends through the support structure 72 and the biasing member 70 to the heat sink 42. The shank portion 122 is capable of reciprocal or sliding movement through the support structure 72, which in turn allows the biasing member 70 to contract and expand. The shank portion 122 can be connected to the heat sink 42 by external threads that can be screwed into the top portion 64 of the heat sink 42. Alternatively, the shank portion 122 can be connected to the heat sink 42 by other attachment means, such as an adhesive or weld. The head portion 124 extends over the support structure 72 and restricts the movement of the stabilization member 120 and the heat sink 42 so that the stabilization member 120 and the heat sink 42 are prevented from longitudinally moving beyond a specified distance. This specified distance can be, for example, within the operational limit of the biasing member 70.

Referring again to FIG. 1, the heat transfer apparatus 15 can further include an attachment means 130 that is used to attach the base member 40 of the heat transfer apparatus 15 to the burn-in board 14. The attachment means 130, as shown in FIGS. 1, 3, and 4, positions the base member 40 relative to the burn-in board 14 such that the base member 40 is substantially separated from the burn-in board 14, and the openings 50 of the base member 40 substantially overlie the sockets 16 of the burn-in board 14. The attachment means 130 comprises a plurality of bolts 132 that extend through corresponding apertures 135 and 136 in the base member 40 and the burn-in board 14. Although, the apertures 135 and 136 are arranged at respective corners of the base member 40 and the burn-in board 14, the apertures 135 and 136 could be provided at other corresponding portions of the base member 40 and the burn-in board 14.

Each bolt 132 includes a head 138 and an externally threaded shank 139. The head 138 of each bolt 132 contacts the top-surface 44 of the base member 40 surrounding the apertures 135 in the base member 40. The shank 139 of each bolt 132 extends through the apertures 135 and 136, respectively, in the base member 40 and the burn-in board 14. Nuts 140 are tightened about the externally threaded shanks 139 of the bolts 132 to secure the burn-in board 14 to the base member 40. It will be appreciated that the attachment means 130 is not meant to be limited to a plurality of bolts 132 and nuts 140. Other attachment means that can readily attach the base member 40 relative the burn-in board 14 such that the base member 40 is substantially separated from the burn-in board 14 and the openings 50 of the base member substantially overlie the sockets 16 of the burn-in board 14 can be used in accordance with the present invention. Examples of these other attachment means can include screws that extend through base member 40 to threaded portions in the burn-in board 14 as well as clamp assemblies and latch assemblies. It will be appreciated that yet other attachment means can be used.

Figure 5:
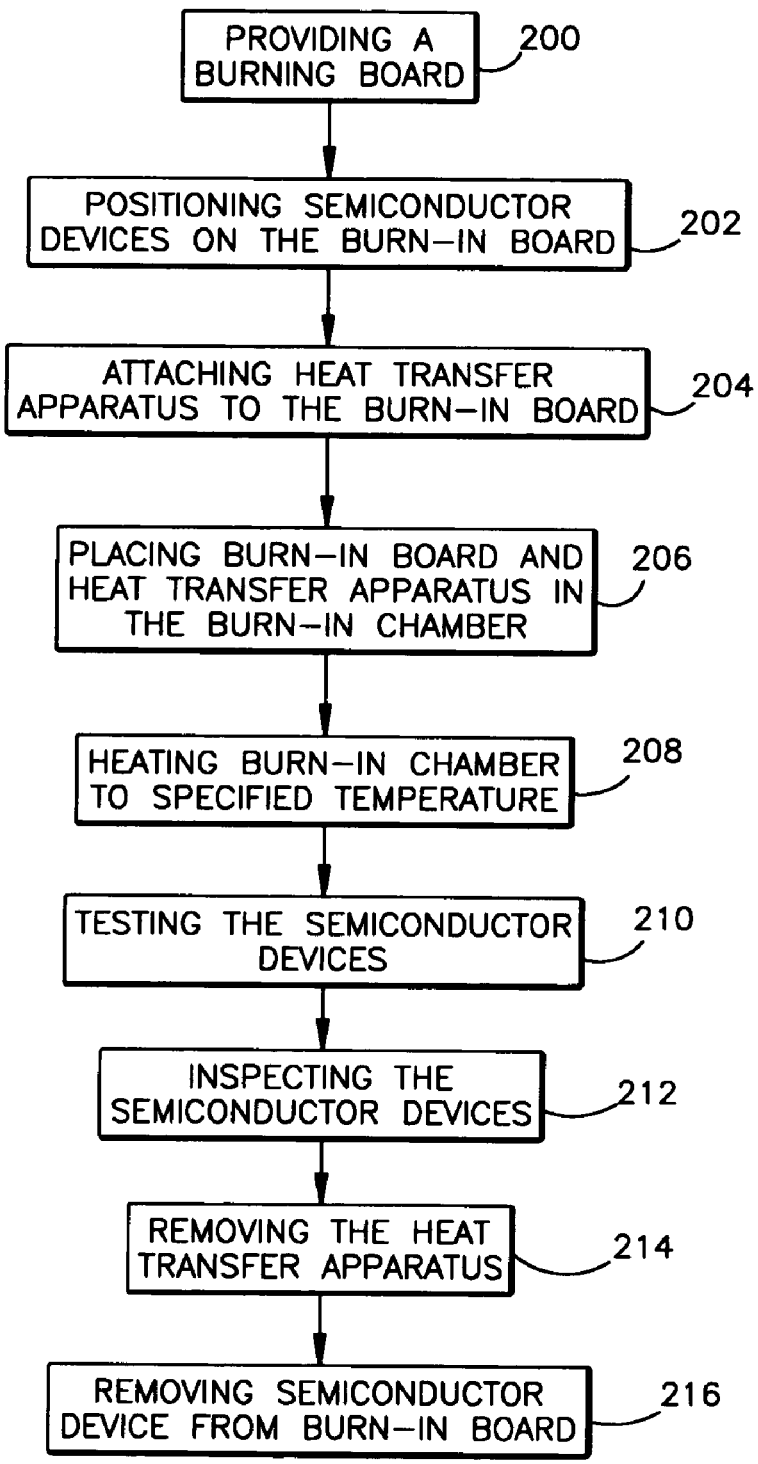
FIG. 5 illustrates a methodology of using the burn-in system in accordance with an aspect of the invention.

FIG. 5 illustrates a methodology by which the burn-in system described above with reference to FIGS. 1–4 can be used in a burn-in testing procedure. At 200, a test apparatus is provided that includes a burn-in board and a plurality sockets arranged on a surface of the burn-in board for temporarily holding semiconductor devices during a burn-in procedure. The sockets can each include a recess for receiving a semiconductor device.

At 202, semiconductor devices to be tested can be positioned in the recesses of the sockets. The semiconductor devices can be positioned in the sockets either manually or automatically using a loading device.

At 204, the apparatus for transferring (or dissipating) heat from semiconductor devices during the burn-in procedure (i.e., heat transfer apparatus) can be attached to the burn-in board, which contains the semiconductor devices to be tested, to form a burn-in system. The heat transfer apparatus can be attached to the burn-in board by placing the base member of the apparatus over the burn-board, aligning the apertures of the base member with corresponding apertures of the burn-in board, and inserting a bolt through each corresponding aperture. The bolts can then be secured by to the base member and the burn-in board with nuts. Openings in the base member are aligned over the sockets of the burn-in board. Heats sinks of the base member are biased against the semiconductor devices.

At 206, the burn-in board with the attached heat transfer apparatus (i.e., burn-in system) is plugged into an edge connector in a rack in a burn-in chamber. The burn-in chamber can be a convection oven that is heated by, for example, an electric heater, or by other beating devices. The atmosphere in the chamber can comprise air and/or other inert gases, such as helium or nitrogen. The burn-in board can be plugged into the edge connector in a rack in an oven after being loaded with the semiconductor devices to be tested. The edge connector electrically connects the semi-conductors devices and sockets to the test signal generating circuits proximate the oven.

At 208, the oven is then closed to seal the burn-in board with the attached heat transfer apparatus while the ambient is heated to a specified burn-in temperature. The specified burn-in temperature can be determined experimentally for a particular class of semiconductor devices. The exact temperature required will depend on factors, such as power dissipation, type of socket, and air flow velocity. It will be appreciated that other factors can be considered in determining the specified burn-in temperature.

At 210, device power and test patterns are applied to the semiconductor devices to test the reliability of the semiconductor devices (i.e., the semiconductor devices are burned-in). The power applied to the semiconductor devices can cause the semiconductor devices to potentially heat to an undesirable temperature. The heat sinks pressed against the semiconductor can dissipate or transfer at least some of the heat from the semiconductor devices to allow the semiconductors to be maintained at a desired burn-in temperature.

At 212, after the reliability of the semiconductor devices are tested, the burn-in board and the heat transfer apparatus are removed from the burn-in chamber and the semiconductor devices are visually inspected and/or repaired, if needed. The visual inspection and/or the repair can be performed through the openings in the base member of the heat transfer apparatus. After visual inspection, the burn-in board and the heat transfer apparatus can be returned to the burn-in chamber for further testing, if desired, or, if no further testing is required, the burn-in system can be disassembled.

At 214, the burn-in system can be disassembled by disconnecting the heat transfer apparatus from the burn-in board. The heat transfer apparatus can be disconnected from the burn-in board by unscrewing the nuts from the bolts and then displacing the heat transfer apparatus.

At 216, the semiconductor devices can be removed from the sockets once the heat transfer apparatus has been disconnected from the burn-in board. The semiconductors are removed from the sockets by displacing the semiconductor devices from the recesses of the sockets.

Figure 6:
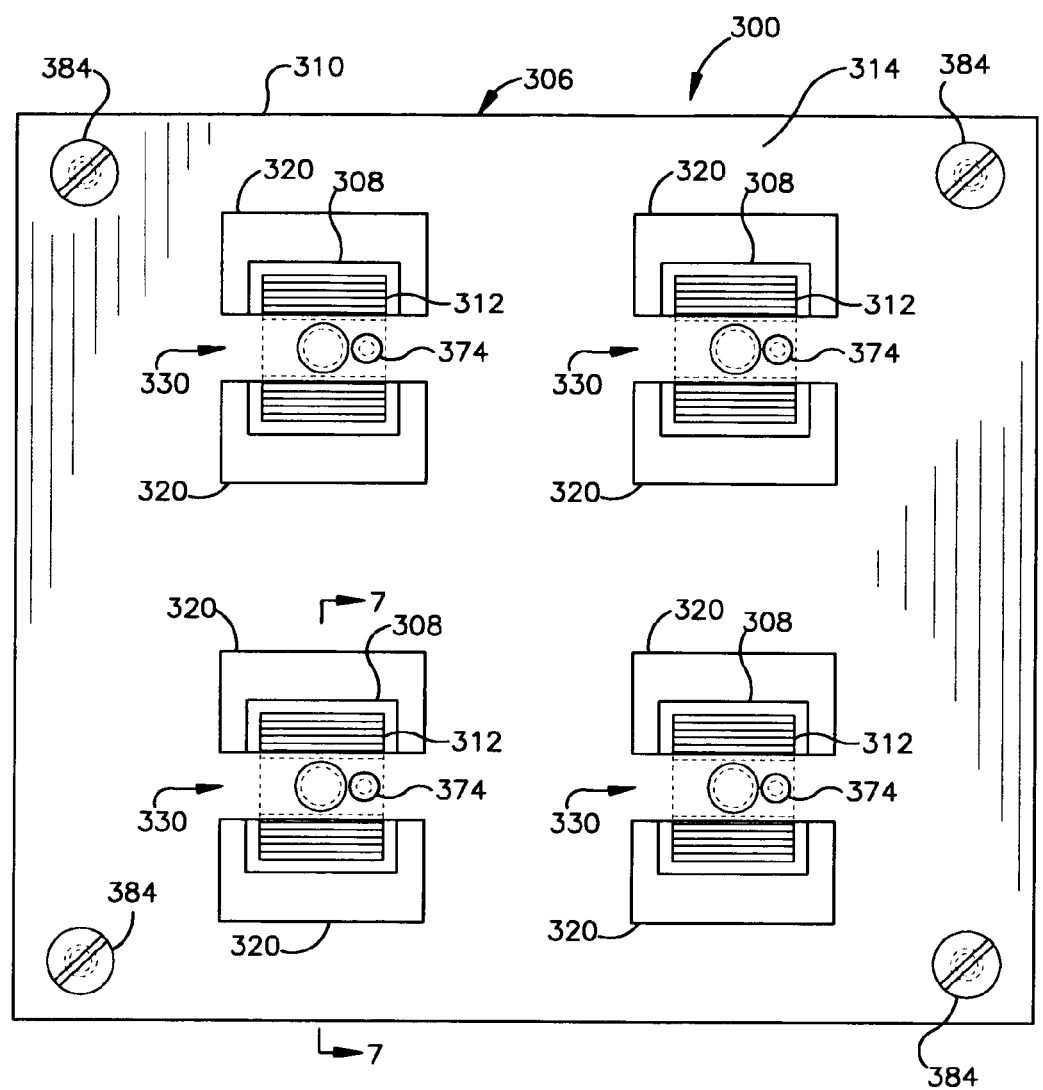
FIG. 6 illustrates a top plan view of a heat transfer apparatus and burn-in board of FIG. 1 in accordance with another aspect of the present invention.
Figure 7:
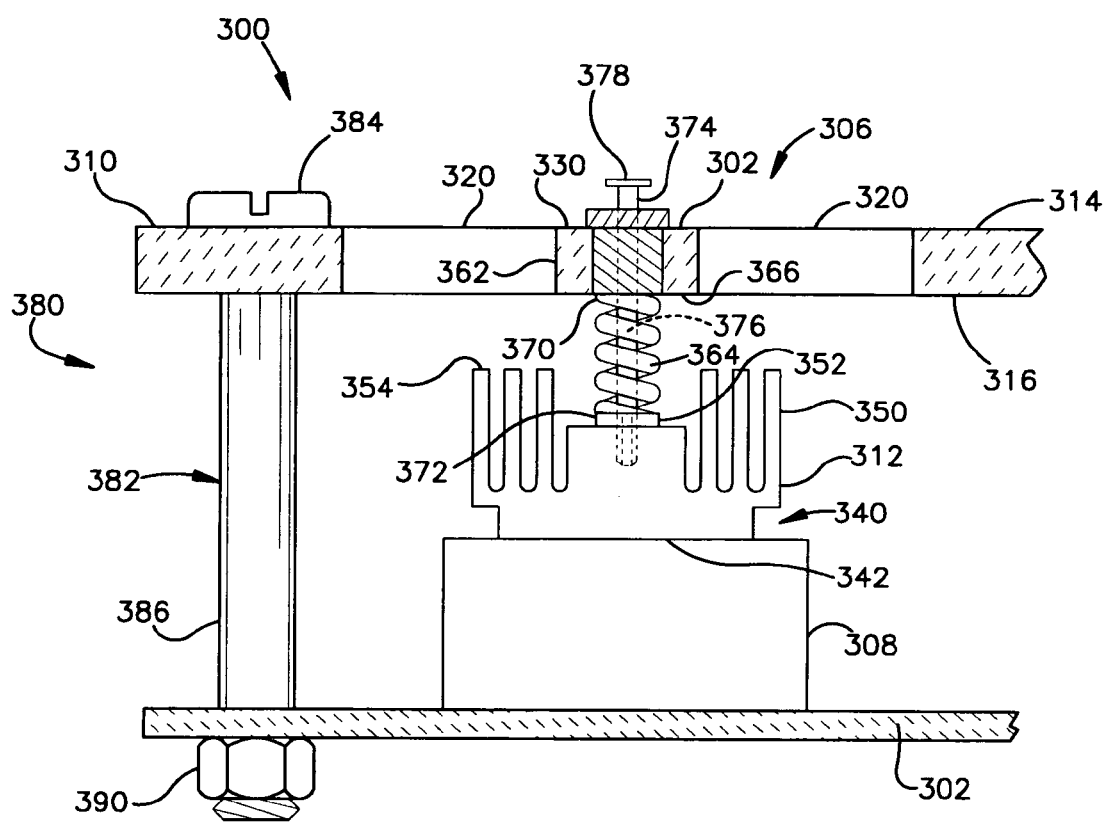
FIG. 7 illustrates a schematic cross-sectional view taken along lines 7—7 of FIG. 6 of a portion of the heat transfer apparatus and burn-in board.

FIGS. 6 and 7 illustrate a burn-in system 300 in accordance with another aspect of the present invention. Referring to FIG. 6, the burn-in system 300 includes a burn-in board 302 for receiving and testing a plurality of semiconductor devices (not shown) and an apparatus 306 (i.e., heat transfer apparatus) for removing heat from the semiconductor devices during the burn-in procedure. The burn-in board 302 has a substantially planar shape and includes a plurality of sockets 308 that are mounted on a surface of the burn-in board 302. The plurality of sockets 308 can temporarily hold the semiconductor devices for electrical communication during testing. The burn-in board 302 can be formed of an electrically insulating material that is substantially rigid and resistant to fatigue. A support member can be used to increase the rigidity (i.e., decrease flexure) of the burn-in board 302.

The burn-in board 302 is adapted for placement in a burn-in chamber (not shown) with temperature cycling capabilities, such as a burn-in convention oven. In addition, the burn-in board 302 can be adapted for electrical connection to testing circuitry (not shown) and programming circuitry (not shown). Specifically the testing circuitry is adapted to apply test signals for testing the semiconductor devices and detecting defects. The programming circuitry is adapted to apply programming signals for correcting programmable defects.

The heat transfer apparatus 306 can be connected to the burn-in board 302 so that the heat transfer apparatus 306 substantially overlies the burn-in board 302. The heat transfer apparatus 306 comprises a base member 310 and a plurality of heat sinks 312 that are connected to the base member 310. The base member 310 comprises a substantially planar plate with a top surface 314 and substantially coplanar bottom surface 316 (FIG. 7). The base member 310 is formed of a substantially rigid material and has a substantially low-profile to minimize obstruction of the air flow during a burn-in procedure performed in a convection oven (not shown).

The base member 310 includes a plurality of substantially rectangular openings 320 that extend through the base member 310 from the top surface 314 to the bottom surface 316 (FIG. 7). The openings 320 are arranged in the base member 310 such that two laterally displaced openings at least partially overlie each socket 308 of the burn-in board 302 to which the base member 310 is attached. Each of the two laterally displaced openings 320 are separated from one another by portions 330 of the base member 310. The portions 330 of the base member 310 that separate the openings 320 each substantially overlie one socket 308 of the burn-in board 302 to which the base member 310 is attached. Arranging two laterally spaced openings 320 to correspond with the sockets 308 of the burn-in board 302 allows the sockets 308 as well as semiconductor devices positioned in the sockets 308 to be readily accessed for repair and measurement.

The openings 320 can be formed in the base member 310, for example, by milling the base member 310 at locations that correspond to locations of the sockets 308 of the burn-in board 302. It will be appreciated that other techniques can be used to form the openings 320 and that these technique can be a function of the particular material from which the base member 310 is formed. It will also be appreciated that although the openings 320 are illustrated as having a substantially rectangular shapes, the openings 320 can have other shapes, such as circular, square, and polygonal.

Each heat sink 312 can extend from the portions 330 of base member 310 that separate the openings 320 such that each heat sink 312 is at least partially aligned below one opening 320 of the base member 310 and over one socket 308 of the burn-in board 302. Referring to FIG. 7, which is a cross-sectional view taken along lines 7–7 of FIG. 6 of one heat sink 312 of the heat transfer apparatus 306 positioned over one socket 308 of the burn-in board, the heat sink 312 can have a bottom portion 340 with a contact surface 342 for contacting an exposed portion of a semiconductor device (not shown) positioned in the socket 308 of the burn-in board 302.

The heat sink 312 provides a thermal mass for absorbing heat that is generated by the semiconductor device while the semiconductor device is being tested, and also acts to dissipate heat away from the semiconductor device. The contact surface 342 of the bottom portion 340 of the heat sink 312 can have length and width dimensions (i.e., surface area) equal to or larger than the length and width of the exposed portion of the semiconductor device to provide the largest area of thermal contact between the heat sink 312 and the semiconductor device. Alternatively, the contact surface 342 can have a surface area that is slightly smaller the surface area of the exposed portion of the semiconductor device. Providing the heat sink 312 with a contact surface 342 that has a surface area slightly smaller than the surface area of the exposed portion of the semiconductor device can be desirable to avoid damaging the edges of the semiconductor device when the heat sink 312 is pressed against the exposed portion of the semiconductor device.

The heat sink 312 can also include a top portion 350 with a top surface 352 that is opposite and spaced apart from the contact surface 342. The top portion 350 can include a plurality of upstanding spaced apart heat dissipating fins 354 that increase the surface area of the top portion 350 of the heat sink 312 and allow the heat sink 312 to more readily dissipate heat.

The heat sink 312 can be made of material that has a high thermal capacitance as well as a high thermal conductance. For example, in one aspect of the invention, the heat sink 312 can comprise a metal, such as anodized aluminum. It will be appreciated that the heat sink 312 can include other metals as well as other non-metal materials, such as thermally conductive ceramics and thermally conductive resins. The heat sink 312 can also contain a thermal interface material along the contact surface 342 to increase the efficiency of thermal transfer of the heat sink 312. Optionally, the heat sink 312 can contain a material, such as nickel, along the contact surface for wear resistance.

Each heat sink 312 is connected to the base member 310 with a biasing member 364. The biasing member 364 provides a consistent force at the interface between the heat sinks 312 and the semiconductor devices loaded in the sockets 308 of the burn-in board 302. Thermal transfer from the semiconductor devices loaded in the sockets 308 of the burn-in board 302 to the heat sinks 312 is dependent on this consistent force. The consistent force provides a consistent thermal transfer, which in turn provides more control of heat transfer during burn-in.

The biasing member 364 suspends the heat sink 312 from a support structure 362. The support structure 362 is defined by the portion 330 of the base member 310 that separates the two holes 320. The support structure 362 extends over the socket 308 of the burn-in board 302 and provides a surface 366 to which the biasing member 364 is attached. Connecting the heat sink 312 to the support structure 362 using the biasing member 364 provides the heat sink 312 with a more compliant fit with the semiconductor device (not shown) loaded in the socket 308 of the burn-in board 302. This more compliant fit provides compensation for dimensional variations in the burn-in board 302 and the base member 310.

The biasing member 364 has a first end 370, which is attached to the surface 366 of the support structure 362 by, for example, a screw, a weld, adhesive or other fastening means, and a second end 372 that is attached to the top portion 350 of the heat sink 312, by, for example, a screw, a weld, adhesive, or other fastening means. The biasing member 364 can comprise any member that is capable of exerting a constant force on the heat sink 312. In one aspect, the biasing member 364 can comprise a spring. The spring can include any type of general compression member which applies a constant force, such as an open or closed in spring, a torsion spring, a load spring, a lever spring, a volute spring, a Belleville washer, a conical compression spring, or any other type of spring. By way of example, the biasing member 364 can be formed from an elastically resilient material, such as spring steel, spring alloys (e.g., beryllium alloys, copper alloys, and aluminum alloys), and other metals that are elastically resilient when formed into a spring. The biasing member 364 can be sized and shaped to exert a predetermined force on the top portion 350 of the heat sink 312. This force can be evenly distributed by the heat sink 312 against the semiconductor device loaded in the socket 308. It will be appreciated that the biasing member 364 can comprises other compliant means and/or moveable means, such as a bellow or lever, which are capable of exerting a constant force against the heat sink 312.

A stabilization member 374 can also be connected to the heat sink 312 to substantially inhibit lateral (i.e., side to side) and torsional (ie., twisting) movement of the heat sink 312 while allowing longitudinal (upward and downward) movement. The stabilization member 374 can include a substantially elongated member that can have a shank portion 376 and a head portion 378. The shank portion 376 extends through the support structure 362 to the heat sink 312. The shank portion 376 is capable of reciprocal or sliding movement through the support structure 362, which in turn allows the biasing member 364 to contract and expand. The shank portion 376 can be connected to the heat sink 312 by external threads that can be screwed into the top portion 350 of the heat sink 312. Alternatively, the shank portion 376 can be connected to the heat sink 312 by other attachment means, such as an adhesive or weld. The head portion 378 extends over the support structure 362 and restricts the movement of the stabilization member 374 and the heat sink 312 so that the stabilization member 374 and the heat sink 312 are prevented from longitudinally moving beyond a specified distance. This specified distance can be, for example, within the operational limit of the biasing member.

The heat transfer apparatus 306 can further include an attachment means 380 that is used to attach the base member 310 to the burn-in board 302. The attachment means 380 positions the base member 310 relative the burn-in board 302 such that the base member 310 is substantially separated the burn-in board 302 and the openings 320 of the base member substantially overlie the sockets 308 of the burn-in board. The attachment means 380 comprises a plurality of bolts 382 that that extend through corresponding apertures in the base member 310 and the burn-in board 302.

Each bolt 382 includes a head 384 and an externally threaded shank 386. The head 384 of each bolt 382 contacts the top-surface 314 of the base member 310 surrounding the apertures in the base member 310. The shank 382 of each bolt extends through the apertures in the base member 310 and the burn-in board 302. Nuts 390 are tightened about the shanks 386 of the bolts 382 to secure the burn-in board 302 to the base member 310. It will be appreciated that attachment means 380 is not meant to be limited to a plurality of bolts 382 and nuts 390. Other attachment means that can readily attach the base member 310 relative the burn-in board 302 such that the base member 310 is substantially separated from the burn-in board 302 and the openings 320 of the base member 310 substantially overlie the sockets 308 of the burn-in board 302 can be used in accordance with the present invention.

The burn-in system 300 depicted in FIGS. 6–7 can function substantially similar as the burn-in system 10 previously described. However, as is apparent, the heat sinks 312, the sockets 308, and the semiconductor devices can be accessed through either of the two openings 320 overlying each heat sink 312, socket 308, and semiconductor device.

Those skilled in the art will also understand and appreciate variations in the burn-in system. For example, it will be appreciated that although the heat transfer apparatus is illustrated as including four heat sinks, the heat transfer apparatus can include more than four heat sinks or less than four heat sinks. Additionally, it will be appreciated that multiple heat sinks can be attached to each bias member and the bias member can bias the multiple heat sinks against multiple sockets. Further, it will be appreciated that at least one metal spacer can be provide on a bottom surface of the base member to support as well as separate the base member from the burn-in board. This at least one spacer can comprise a member that extends substantially the length of the base member. Moreover, it will be appreciated that more than one stabilization members can be provided for each heat sink and that these stabilization members can extend from the support structure and/or the base member.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An apparatus for transferring heat from semiconductive devices during a burn-in operation, comprising:
   a. a base board;
   b. a plurality of openings extending through the base board for inspecting and repairing a semiconductor device;
   c. heat sinks coordinated with the openings, each having a contact surface for engaging a semiconductor device positioned in a socket of a burn-in board; and
   d. biasing members having two ends; one end mounted on the base board and the other end connected to a heat sink for urging the contact surface of the heat sink against a semiconductor device.

2. The apparatus of claim 1, in which the base board is further attached to the burn-in board having a plurality of sockets for semiconductive devices, and the sinks are positioned between the base board and the burn-in board.

3. The apparatus of claim 1, in which the openings provide access for measuring semiconductive devices in the sockets.

4. The apparatus of claim 2, further comprising, between the base board and the burn-in board, a path for laminar airflow around the semiconductive devices in the sockets.

5. The apparatus of claim 1, in which the heat sinks include upstanding fins.

6. The apparatus of claim 1, in which the biasing member further comprises a stabilization member retractably extending through the base board for limiting the movement of the heat sink laterally.

7. A method for burn-in semiconductor devices; comprising
   a. providing a burn-in board with a plurality of sockets;
   b. populating the sockets with semiconductor devices under burn-in;
   c. attaching to the burn-in board an apparatus, which includes:
      i. a base board;
      ii. a plurality of openings extending through the base board for inspecting and repairing a semiconductor device;
      iii. heat sinks coordinated with the openings, each having a contact surface for engaging a semiconductor device positioned in a socket of a burn-in board; and
      iv. biasing members having two ends; one end mounted on the base board and the other end connected to a heat sink for urging the contact surface of the heat sink against a semiconductor device;
   d. raising the temperature near the sockets to a desirable degree;
   e. engaging the heat sinks to the semiconductor devices to maintain the devices at a desirable temperature; and
   f. burning-in the semiconductor devices.

8. The method of claim 7, further comprising providing laminate airflow between the base board and the burn-in board and directing the airflow to the vicinity of the semiconductor devices to maintain a desirable device temperature.

9. The method of claim 7, further comprising the steps of inspecting the semiconductors via the openings on the base board.

10. The method of claim 7, further comprising the steps of repairing the semiconductors via the openings on the base board.

11. The method of claim 7, further comprising the steps of measuring the semiconductors via the openings on the base board.

* * * * *

UNITED STATES PATENT AND TRADEMARK OFFICE
CERTIFICATE OF CORRECTION

PATENT NO. : 6,956,392 B2  
APPLICATION NO. : 10/750437  
DATED : October 18, 2005  
INVENTOR(S) : Wright et al.

Page 1 of 1

It is certified that error appears in the above-identified patent and that said Letters Patent is hereby corrected as shown below:

Title Page, Item (12), delete "Wright" and insert -- Wright et al. --.

Title Page, Item (75), Inventors, should read:  
INVENTOR(S): Nathan W. Wright, Missouri City, TX  
Ronnie R. Schkade, Houston, TX  
Richard J. Karr, Rowlett, TX  
Noel T. Gregorio, Baguio City, Philippines  
Bill Taylor, Needville, TX  
Charles R. Engle, Missouri City, TX Signed and Sealed this  
Thirteenth Day of November, 2012

David J. Kappos  
*Director of the United States Patent and Trademark Office*